(12) United States Patent
Park et al.

(10) Patent No.: US 11,942,338 B2
(45) Date of Patent: Mar. 26, 2024

(54) APPARATUS FOR MANUFACTURING DISPLAY DEVICE

(71) Applicant: Samsung Display Co., LTD., Yongin-si (KR)

(72) Inventors: Jong Jang Park, Suwon-si (KR); Seok Soon Back, Suwon-si (KR); Sung Hune Yoo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 297 days.

(21) Appl. No.: 17/348,316

(22) Filed: Jun. 15, 2021

(65) Prior Publication Data

US 2021/0407828 A1    Dec. 30, 2021

(30) Foreign Application Priority Data

Jun. 26, 2020 (KR) .................. 10-2020-0078370

(51) Int. Cl.
*H01L 21/67* (2006.01)
*H01L 27/12* (2006.01)

(52) U.S. Cl.
CPC .... *H01L 21/67109* (2013.01); *H01L 27/1259* (2013.01)

(58) Field of Classification Search
CPC ......... H01L 21/67109; H01L 21/68742; H01L 21/67248
See application file for complete search history.

(56) References Cited

U.S. PATENT DOCUMENTS

| | | | |
|---|---|---|---|
| 6,111,225 A * | 8/2000 | Ohkase | H01L 21/67109 |
| | | | 118/724 |
| 2004/0060917 A1* | 4/2004 | Liu | F27B 17/0025 |
| | | | 219/390 |
| 2013/0087309 A1* | 4/2013 | Volfovski | H01L 21/6875 |
| | | | 219/385 |
| 2016/0276379 A1* | 9/2016 | Hamada | H01L 21/67051 |

FOREIGN PATENT DOCUMENTS

| | | |
|---|---|---|
| JP | 2018133144 A | 8/2018 |
| JP | 2018139262 A | 9/2018 |
| KR | 20030047541 A | 6/2003 |
| KR | 1020040067561 A | 7/2004 |
| KR | 1020060064207 A | 6/2006 |
| KR | 1020070051646 A | 5/2007 |
| KR | 1020210057274 A | 5/2021 |

* cited by examiner

*Primary Examiner* — Alexander P Gross
(74) *Attorney, Agent, or Firm* — CANTOR COLBURN LLP

(57) ABSTRACT

An apparatus for manufacturing a display device includes a chamber, a heating member disposed inside the chamber to provide a thermal atmosphere inside the chamber, where the heating member includes a first heater and a second heater facing each other, a height adjustment member including an end disposed between the first heater and the second heater, and a driving unit which drives the end of the height adjustment member to move up or down such that the end of the height adjustment member is located at one of a first height and a second height which are different heights between the first heater and the second heater. Each of the first height and the second height is different from a height of a top surface of the first heater, and different from a height of a bottom surface of the second heater facing the top surface of the first heater.

20 Claims, 13 Drawing Sheets

APPARATUS FOR MANUFACTURING DISPLAY DEVICE

This application claims priority to Korean Patent Application No. 10-2020-0078370, filed on Jun. 26, 2020, and all the benefits accruing therefrom under 35 U.S.C. 119, the content of which in its entirety is herein incorporated by reference.

BACKGROUND

1. Field

The disclosure relates to an apparatus for manufacturing a display device.

2. Description of the Related Art

The importance of display devices has steadily increased with the development of multimedia technology. Accordingly, various types of display device such as a liquid crystal display ("LCD"), an organic light emitting display ("OLED") and the like have been widely used in recent.

Among the display devices, a self-light emitting display device includes a self-light emitting element such as an organic light emitting diode. The self-light emitting element may include two opposite electrodes and a light emitting layer interposed therebetween. In the case of using the organic light emitting diode as the self-light emitting element, the electrons and holes from the two electrodes are recombined in the light emitting layer to produce excitons, which transition from the excited state to the ground state, emitting light.

A process of manufacturing the organic light emitting diode may include a process of baking a target substrate on which a plurality of thin films are formed. Such a bake process is performed by applying heat to the target substrate mainly by using a heater.

SUMMARY

Embodiments of the disclosure provide an apparatus for manufacturing a display device that is capable of uniformly heat-treating a large area substrate and adjusting a process temperature profile.

An embodiment of an apparatus for manufacturing a display device includes a chamber, a heating member disposed inside the chamber to provide a thermal atmosphere inside the chamber, where the heating member includes a first heater and a second heater facing each other, a height adjustment member including an end disposed between the first heater and the second heater, and a driving unit which drives the end of the height adjustment member to move up or down such that the end of the height adjustment member is located at one of a first height and a second height which are different heights between the first heater and the second heater, where each of the first height and the second height is different from a height of a top surface of the first heater, and different from a height of a bottom surface of the second heater facing the top surface of the first heater.

An embodiment of an apparatus for manufacturing a display device includes a chamber, a heating member including a first heater disposed at a lower part of the chamber and a second heater disposed at an upper part of the chamber, a height adjustment member which supports a target substrate, where at least a portion of the height adjustment member is disposed between the first heater and the second heater, and a driving unit which adjusts a height of the target substrate by raising or lowering the height adjustment member to a predetermined height, wherein each of a width of the first heater and a width of the second heater is greater than a width of the target substrate, and each of a side surface of the first heater and a side surface of the second heater protrudes further outward than a side surface of the target substrate.

In such embodiments, the apparatus for manufacturing a display device may perform uniform heat-treating on a large area substrate with adjusted process temperature profile.

The effects of the disclosure are not limited to the aforementioned effects, and various other effects are included in the specification.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
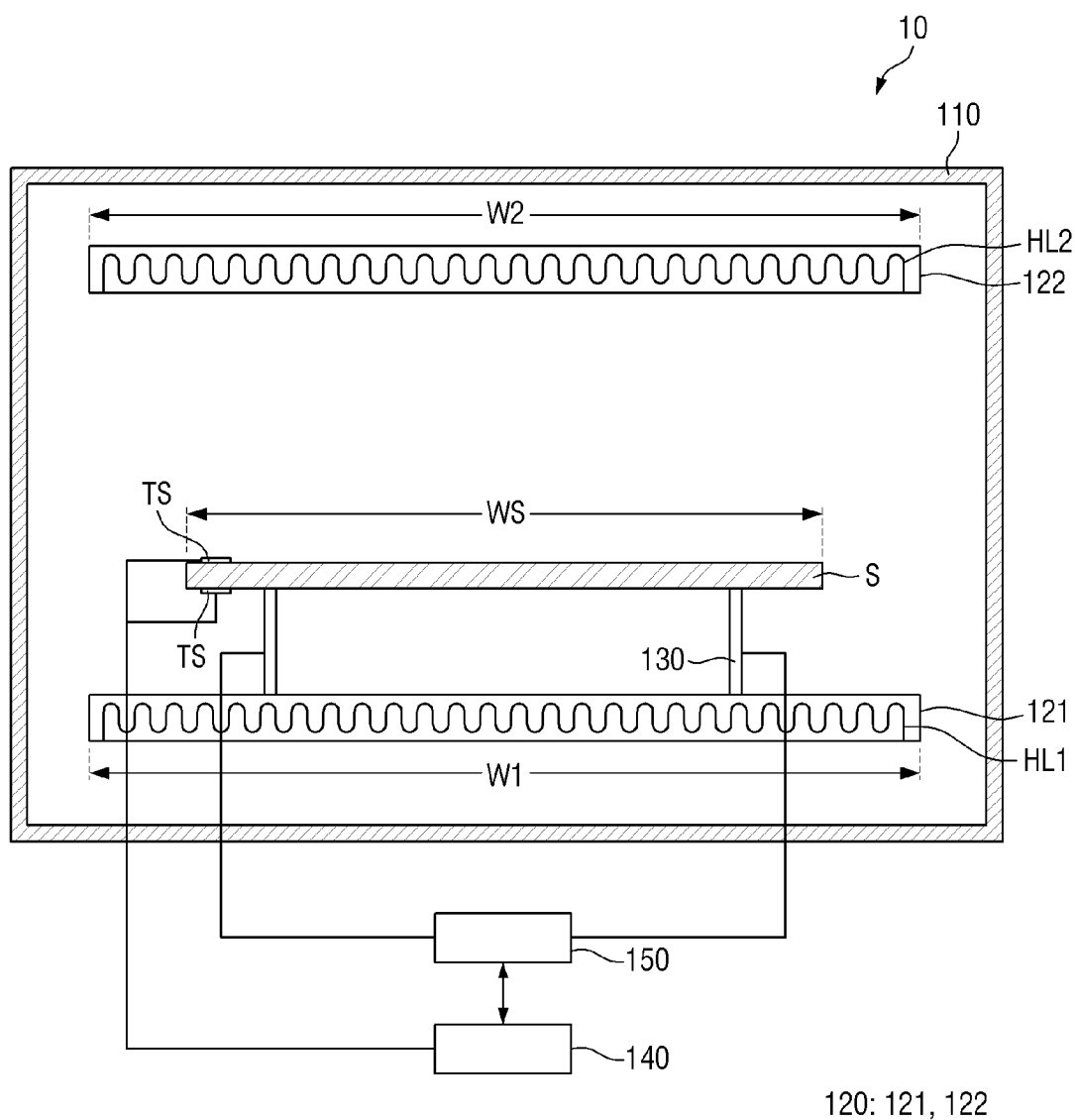
FIG. 1 is a view schematically illustrating a manufacturing apparatus according to an embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

Figure 2:
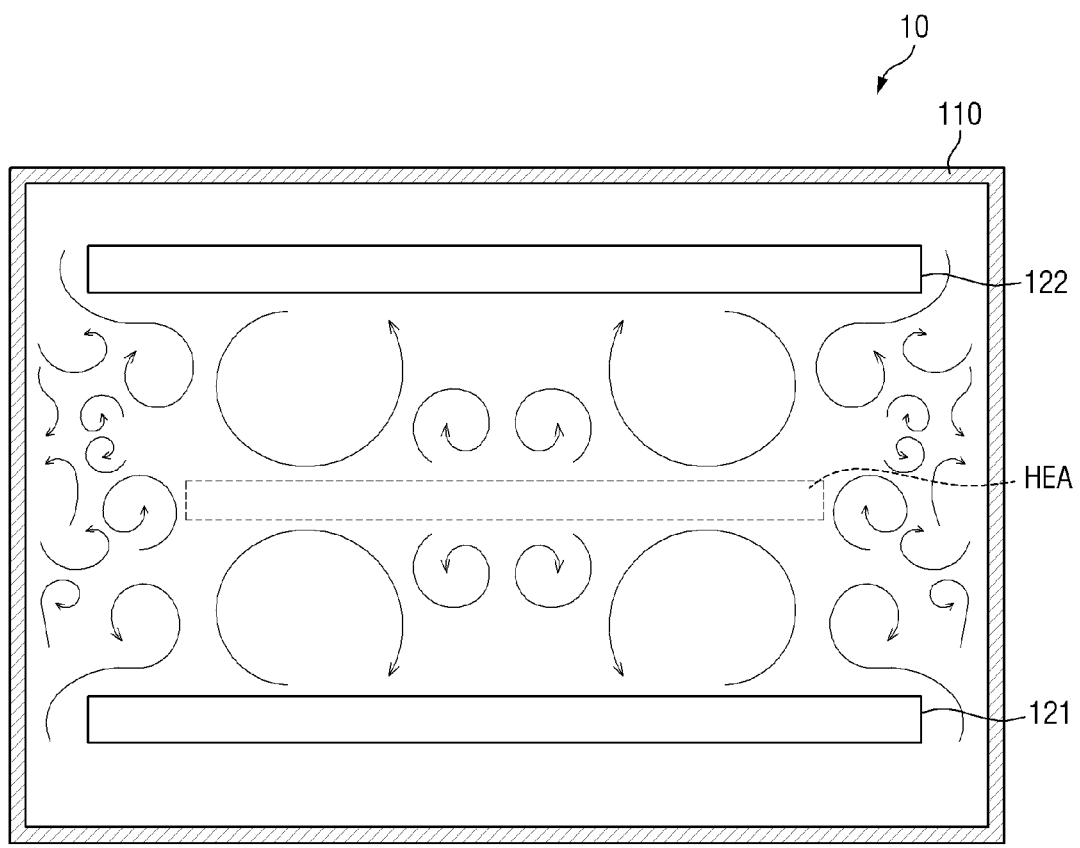
FIG. 2 is a view schematically illustrating heat flows inside a chamber.
Figure 3:
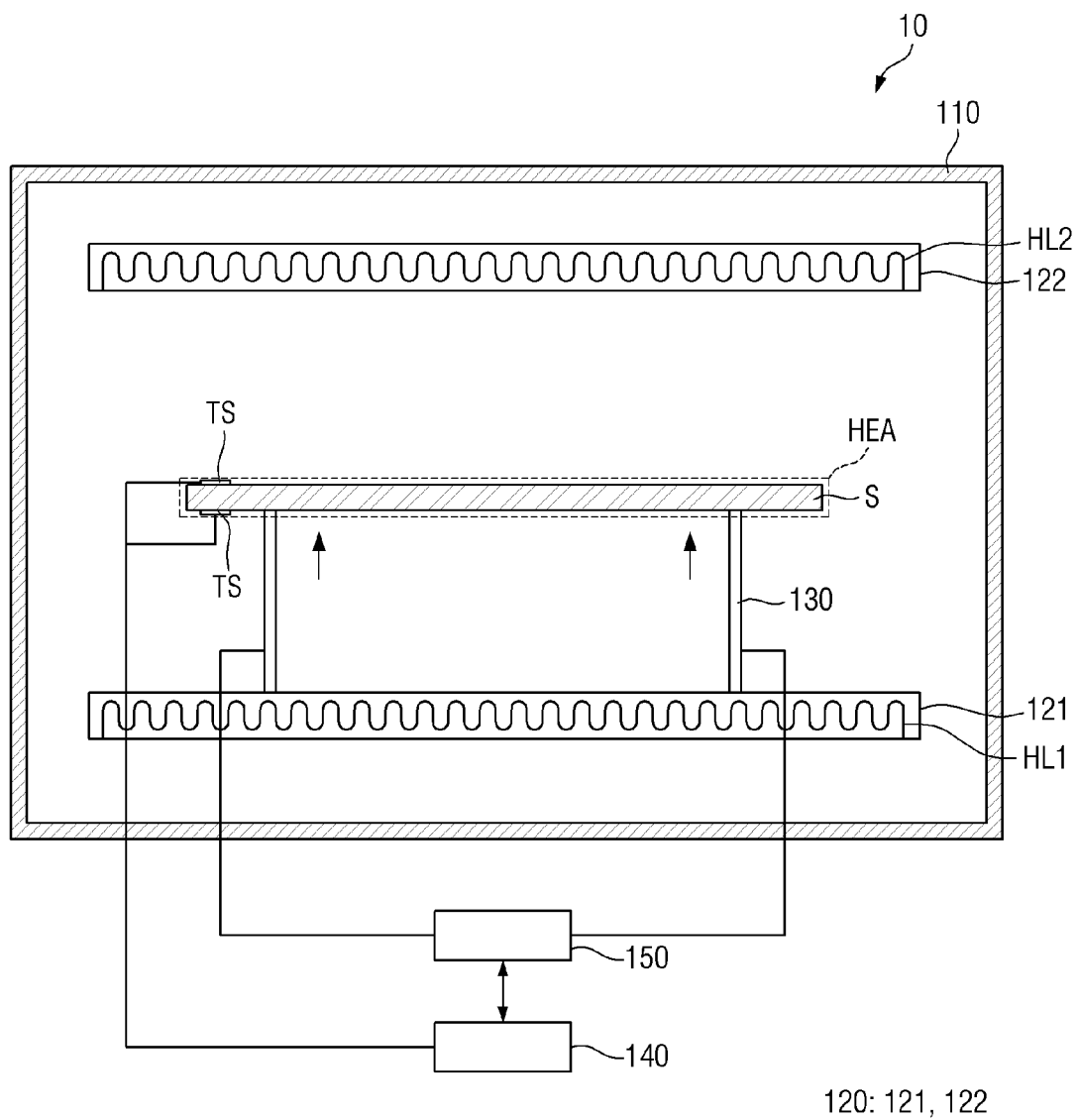
FIG. 3 is a view illustrating a scene in which a target substrate is arranged in a thermal equilibrium zone of a chamber according to an embodiment.

FIG. 1 is a view schematically illustrating a manufacturing apparatus according to an embodiment. FIG. 2 is a view schematically illustrating heat flows inside a chamber. FIG. 3 is a view illustrating a scene in which a target substrate is arranged in a thermal equilibrium zone of a chamber according to an embodiment.

FIG. 2 shows a chamber 110 and a heating member 120 according to an embodiment. Heat flows in an embodiment are shown in FIG. 2, but the disclosure is not limited thereto. FIG. 3 shows an embodiment in which a target substrate S moves to a thermal equilibrium zone HEA by a height adjustment member 130.

Referring to FIGS. 1 to 3, an embodiment of a manufacturing apparatus 10 of a display device may include a chamber 110, a heating member 120, a height adjustment member 130, a comparison operation unit 140, and a driving unit 150.

The chamber 110 defines an empty inner space in which heaters 121 and 122 and the height adjustment member 130 and the like may be disposed. In one embodiment, for example, the chamber 110 may provide a space for performing a bake process, but the disclosure is not limited thereto. In an embodiment, as shown in FIG. 1 the chamber 110 may have a rectangular parallelepiped shape, but the disclosure is not limited thereto. Alternatively, the chamber 110 may have any of various shapes. A heat treatment atmosphere may be provided inside the chamber 110. In an embodiment, the first and second heaters 121 and 122 may be arranged inside the chamber 110 to provide the heat treatment atmosphere.

The heating member 120 may provide heat used for performing the bake process. The heating member 120 may apply the heat to the target substrate S. The heating member 120 may include the first and second heaters 121 and 122. The first and second heaters 121 and 122 may face or be disposed opposite to each other, and the target substrate S may be arranged between the first and second heaters 121 and 122. The first and second heaters 121 and 122 may be parallel to each other.

The first and second heaters 121 and 122 may be arranged respectively at lower and upper parts of the chamber 110 to face each other. The first heater 121, as a main heater, may form the thermal atmosphere inside the chamber 110. The second heater 122, as an auxiliary heater, may be arranged to be distanced from the first heater 121 and provide further heat to the space distanced from the first heater 121. The second heater 122 may serve to uniformly form the thermal atmosphere inside the chamber 110. That is, the second heater 122 arranged in addition to the first heater 121 inside the chamber 110 may improve the temperature uniformity inside the chamber 110.

The first and second heaters 121 and 122 may include respective heating wires HL1 and HL2 and a power supply unit (not shown). In an embodiment, the first heater 121 may include a first heating wire HL1 located therein, and the second heater 122 may include a second heating wire HL2 located therein. The first and second heating wires HL1 and HL2 may be supplied with power from the power supply unit (not shown) and heat the first and second heaters 121 and 122. The first and second heaters 121 and 122 heated by the heating wires HL1 and HL2 may form a thermal atmosphere inside the chamber 110.

A thermal equilibrium zone HEA in which heat is equilibrated may be formed between the first and second heaters 121 and 122. The thermal equilibrium zone HEA may be thermally uniform therein. That is, the first and second heaters 121 and 122 may emit heat, and the heat may be transferred to each area inside the chamber 110 by convection and/or radiation. Although the first and second heaters 121 and 122 emit heat to form a heat treatment atmosphere inside the chamber 110 and the heat is transferred by convection and/or radiation, a thermal equilibrium state is achieved in a partial area (thermal equilibrium zone HEA) in which the temperature is uniform and may remain uniform over the whole area. The location of the thermal equilibrium zone HEA may vary based on the temperatures of the first and second heaters 121 and 122.

As the heat emitted by the first and second heaters 121 and 122 is transferred by convection and/or radiation, the heat emitted by first heater 121 and the heat emitted by the second heater 122 may establish equilibrium with each other in the thermal equilibrium zone HEA, which may remain in a thermally uniform state over the whole area thereof. In such an embodiment, the heats emitted from the first and second heaters 121 and 122 are uniform and/or the temperatures of the first and second heaters 121 and 122 are uniform, such that the thermal equilibrium zone HEA may remain at a uniform temperature over the whole area thereof and maintain a same temperature over the whole area thereof.

In such an embodiment, when the target substrate S is arranged in the thermal equilibrium zone HEA by means of the height adjustment member 130 to be described later, the bake process may be performed such that a same temperature is applied over the whole area of the target substrate S. Accordingly, in such an embodiment, the pixels located at different positions may be uniformly heat-treated to avoid or prevent defects, such as luminance differences and stains on the display device, caused by the pixels being located at different positions and thus fabricated with different temperatures.

The first and second heaters 121 and 122 may fully cover the target substrate S. A width W1 of the first heater 121 may be greater than a width WS of the target substrate S, and a width W2 of the second heater 122 may be greater than the width WS of the target substrate S. The side surfaces of the first heater 121 may protrude outward beyond the side surfaces of the target substrate S, and the side surfaces of the second heater 122 may protrude outward beyond the side surfaces of the target substrate S. The planar area of the first heater 121 may be larger than the planar area of the target substrate S, and the planar area of the second heater 122 may be greater than the planar area of the target substrate S. The entire region of the target substrate S may overlap the first heater 121 in the thickness direction, and may overlap the second heater 122 in the thickness direction. In such an embodiment, the edge of the first heater 121 may surround the edge of the target substrate S in a plan view, and the edge of the second heater 122 may surround the edge of the target substrate S in a plan view.

The width W1 of the first heater 121 and the width W2 of the second heater 122 may be substantially equal to each other, and the side surfaces of the first heater 121 may be aligned with the side surfaces of the second heater 122, but the disclosure is not limited thereto. In an embodiment where the width W1 of the first heater 121 and the width W2 of the second heater 122 are equal to each other, the thermal atmosphere inside the chamber 110 may be effectively uniformly provided.

In an embodiment where the width W1 of the first heater 121 and the width W2 of the second heater 122 are each greater than the width WS of the target substrate S, and the side surfaces of the first heater 121 and the side surfaces of the second heater 122 protrude outward beyond the side surfaces of the target substrate S, the heat treatment may be further uniformly performed over the whole area of the target substrate S. In such an embodiment, the inside (overlap area in the thickness direction) and the outside (non-overlap area in the thickness direction) of the first and second heaters 121 and 122 may differ in thermal atmosphere such that convection and/or radiation may actively occur along the boundary between the inside and the outside, which means that the thermal atmosphere is not uniform around the edge of the inside.

In an embodiment, the side surface of the first heater 121 and the edge of the second heater 122 may be protruded outward beyond the edge of the target substrate S such that the boundaries between the inside and outside of the first and second heaters 121 and 122 are separated by a predetermined distance from the target substrate S. In such an embodiment, the edge and center areas of the target substrate S are effectively prevented from being in different heat treatment atmospheres such that the bake process may be allowed to be performed at a same or constant temperature over the whole area of the substrate S.

In an embodiment, the manufacturing apparatus 10 of a display device may further include a location measurement unit TS for measuring a location of the thermal equilibrium zone HEA. The location measurement unit TS may be arranged on the target substrate S. In one embodiment, for example, the location measurement unit TS may be arranged on the top surface and/or the bottom surface of the target substrate S, but not being limited thereto. The location measurement unit TS may also be arranged on one of the top, bottom and side surfaces of the target substrate S or on the height adjustment member 130, although not limited thereto.

The location measurement unit TS may include a temperature sensor for measuring the temperature inside the chamber. The temperature sensor may measure the temperature inside the chamber 110, a change of the temperature, and a location of the thermal equilibrium zone HEA according to the location of the location measurement unit TS. In an alternative embodiment, the location of the thermal equilibrium zone HEA may be measured based on the temperatures of the first and second heaters 121 and 122 to acquire data on the measurement and/or a function between the temperatures of the first and second heaters 121 and 122 and the thermal equilibrium zone HEA. In such an embodiment, the location measurement unit TS may be connected to the first and second heater 121 and 122 to measure the location of the thermal equilibrium zone HEA based on the data and/or function pre-stored according to the temperatures of the first and second heaters 121 and 122.

The height adjustment member 130 may support the target substrate S. The height adjustment member 130 may be at least partially arranged between the first and second heaters 121 and 122. The target substrate S may be arranged on one end (e.g., a top end) of the height adjustment member 130. The one end of the height adjustment member 130 may be arranged between the first and second heaters 121 and 122.

The height adjustment member 130 may support the target substrate S, e.g., the edge of the target substrate S, such that the target substrate S is disposed along the horizontal direction. The height adjustment member 130 may move up and down in the thickness direction of the first heater 121 and/or the second heater 122. Accordingly, the target substrate S placed on the height adjustment member 130 may be moved upward and downward in the thickness direction of the first heater 121 and/or the second heater 122 to adjust the height of the target substrate S. In such an embodiment, the height adjustment member 130 may adjust the gap between the first heater 121 and the target substrate S.

By adjusting the height of the target substrate S with the height adjustment member 130, the target substrate S, even when the size of the target substrate S increases, may be distanced from the first heater 121 and/or the second heater 122 to be exposed to the uniform thermal atmosphere.

Heat quantity K may be proportional to a multiplication of heat capacity C and temperature change amount T as shown in Equation 1 ("Eq. 1") below, and the heat capacity C may be proportional to a multiplication of specific heat S and mass G as shown in Equation 2 ("Eq. 2") below.

$$K = C \times T \qquad \text{Eq. 1}$$

$$C = S \times G \qquad \text{Eq. 2}$$

That is, the first and second heaters 121 and 122 may increase in size (area) as the target substrate S becomes bigger in size (larger in area). Because the heat quantity K for heating the first and second heaters 121 and 122 is proportional to the mass G, as the target substrate S becomes bigger in size (larger in area), it is desired for the first and second heaters 121 and 122 to increase in size and decrease in thickness and for the heat quantity K to increase. However, there are limits to decreasing the thickness of the first and second heaters 121 and 122 and increasing the heat quantity K.

Accordingly, when arranging the target substrate S on the first heater 121 or the second heater 122 to heat the target substrate S, it may be difficult for the temperature of the first heater 121 and/or the temperature of the second heater 122 to reach a desired temperature of the bake process for the target substrate S, and the temperature may vary among areas.

In an embodiment of the invention, the manufacturing apparatus 10 of a display device includes the second heater 122 as well as the first heater 121, and the target substrate S is distanced from the first and second heaters 121 and 122 by using the height adjustment member 130 such that the bake process may be performed with a uniform thermal atmosphere over the whole area of the target substrate S. However, the disclosure is not limited thereto, and alternatively, the target substrate S may selectively contact the first heater 121 during the heating process.

The height adjustment member 130 may support the target substrate S such that the target substrate S is arranged in parallel with the first heater 121 and/or the second heater 122. The target substrate S placed on the height adjustment member 130 may be distanced from the first heater 121 and the second heater 122. Accordingly, the target substrate S may differ in temperature from the first heater 121 and/or the second heater 122.

Although not shown, the height adjustment member 130 may be arranged on the bottom surface of the chamber 110 through the first heater 121. However, the disclosure is not limited thereto, and alternatively, the height adjustment member 130 may be arranged on the first heater 121 or one side surface of the chamber 110.

The comparison operation unit 140 may compare the location of the target substrate S with the location of the thermal equilibrium zone HEA. In an embodiment, the comparison operation unit 140 may compare the location of the target substrate S with the location of the thermal equilibrium zone HEA acquired by the location measurement unit TS and send a comparison result to the driving unit 150.

The driving unit 150 may drive the height adjustment member 130 to move up and down in the thickness direction of the first heater 121 and/or the second heater 122. In an embodiment, the driving unit 150 may drive the height adjustment member 130 to adjust the height of one end (e.g., a top end) of the height adjustment member 130. Accordingly, the height of the target substrate S placed on the one end (e.g., the top end) of the height adjustment member 130 may be adjusted.

The driving unit 150 may adjust one end of the height adjustment member 130 to be placed at a different height. The term "height" as used herein denotes a distance between the one end of the height adjustment member 130 and the top surface (or bottom surface opposed to the top surface) of the first heater 131. That is, the driving unit 150 may adjust the distance between the one end of the height adjustment member 130 and the top or bottom surface of the first heater 121. The driving unit 150 may also adjust the distance between the one end of the height adjustment member and the top or bottom surface of the second heater 122.

However, the disclosure is not limited thereto, and the driving unit 150 may, for example, locate the one end of the height adjustment member 130 at one of a first height and a second height. The distance between the one end of the height adjustment member 130 at the first height and the top surface of the first heater 121 may differ from the distance between the one end of the height adjustment member 130 at the second height and the top surface of the first heater 121. In such an embodiment, the distance between the one end of the height adjustment member 130 at the first height and the bottom surface of the second heater 122 may differ from the distance between the one end of the height adjustment member 130 at the second height and the bottom surface of the second heater 122.

In an embodiment, the distance between the one end of the height adjustment member 130 at the first height and the top surface of the first heater 121 may be less than the distance between the one end of the height adjustment member 130 and the bottom surface of the second heater 122, and the distance between the one end of the height adjustment member 130 at the second height and the top surface of the first heater 121 may be greater than the distance between the one end of the height adjustment member 130 and the bottom surface of the second heater 122.

The driving unit 150 may drive the height adjustment member 130 based on the comparison result received from the comparison operation unit 140 such that the target substrate S is arranged in the thermal equilibrium zone HEA. Accordingly, in such an embodiment, the target substrate S may move into the thermal equilibrium zone HEA. In an embodiment, the driving unit 150 may be arranged outside the chamber 110, but the disclosure is not limited thereto. Alternatively, the driving unit 150 may be arranged inside the chamber 110.

The driving unit 150 may adjust the height of the height adjustment member 130 to locate the target substrate S at one of a plurality of different heights and fix the target substrate S at the location for performing the bake process. The temperature increase and decrease rate of the target substrate S may vary according to the location of the target substrate S, which may cause the characteristic of the target substrate S, after the bake process, to vary. That is, it may be possible to adjust the location (or height) of the target substrate S by the height adjustment member 130, thereby adjusting the characteristic of the target substrate S. Such features will hereinafter be described in greater with reference to FIGS. 4 and 5.

Figure 4:
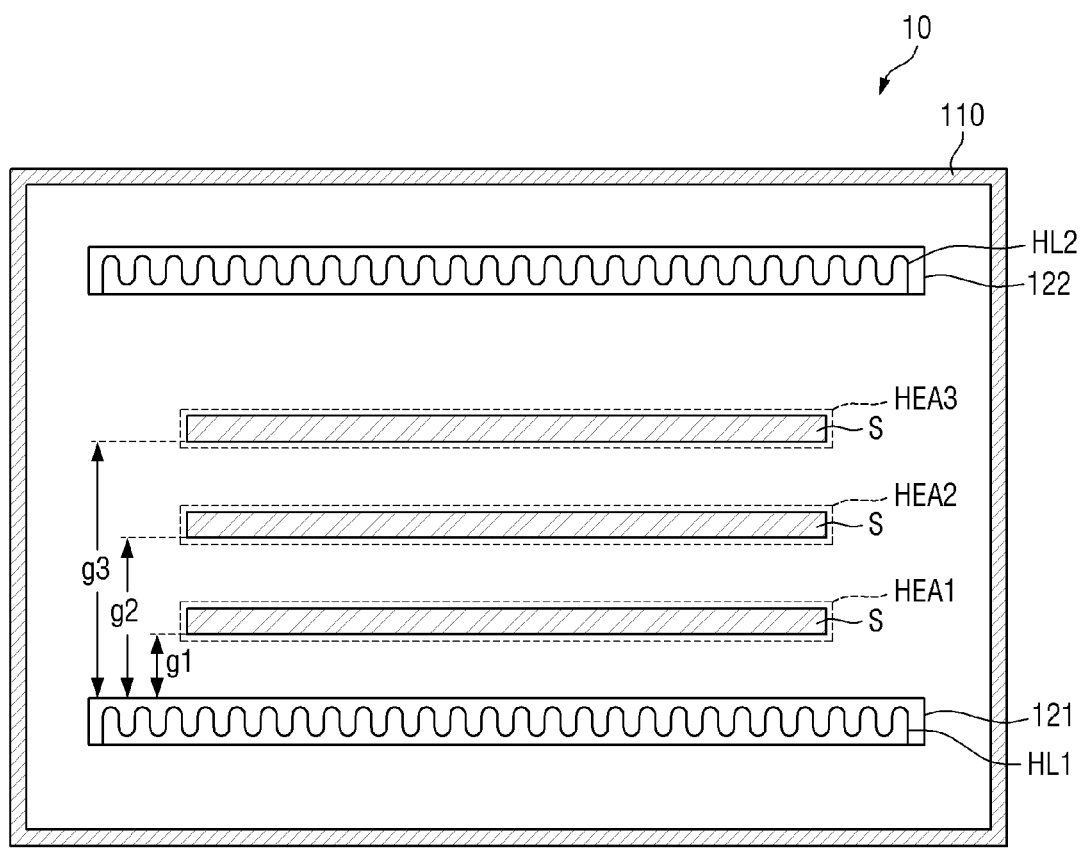
FIG. 4 is a view illustrating a thermal equilibrium location varying according to a temperature inside a chamber according to an embodiment.
Figure 5:
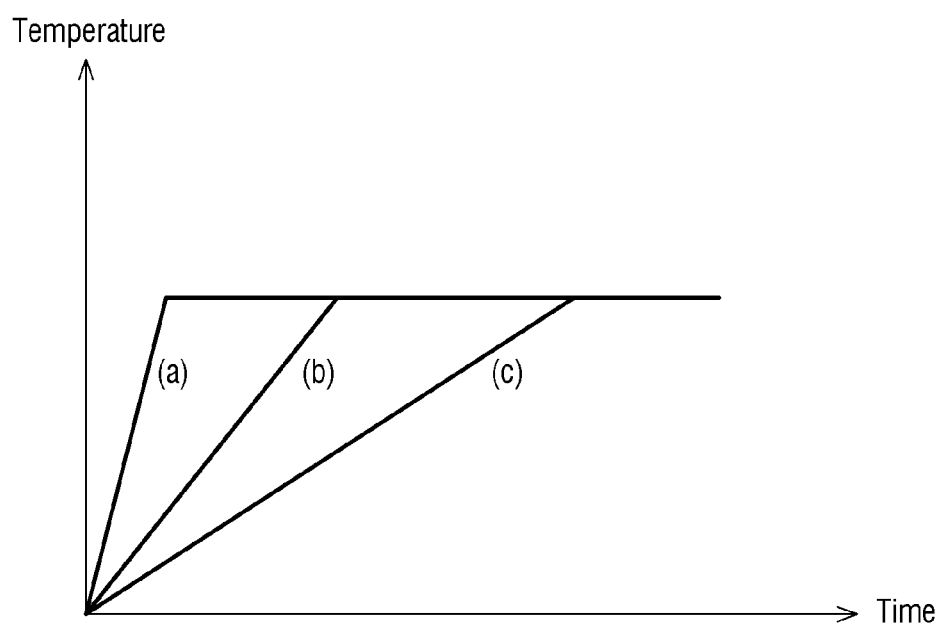
FIG. 5 is a graph of a temperature increase rate of a target substrate varying according to a distance between a first heater and a target substrate according to an embodiment.

FIG. 4 is a view illustrating a thermal equilibrium location varying according to a temperature inside a chamber according to an embodiment. FIG. 5 is a graph of a temperature increase rate of a target substrate varying according to a distance between a first heater and a target substrate according to an embodiment.

In an embodiment, referring to FIG. 4, a plurality of thermal equilibrium zones HEA1, HEA2, and HEA3 may be formed at different areas between the first and second heaters 121 and 122 inside the chamber 110. The thermal equilibrium zones HEA1, HEA2, and HEA3 may differ in internal temperature.

However, the disclosure is not limited thereto, and the thermal equilibrium zones HEA1, HEA2, and HEA3 may have the internal temperature, which increases as the distance g1, g2, g3 from the first heater 121 decreases. That is, the distance g2 between the second thermal equilibrium zone HEA2 and the first heater 121 may be greater than the distance g1 between the first thermal equilibrium zone HEA1 and the first heater 121, and the distance g3 between the third thermal equilibrium zone HEA3 and the first heater 121 may be greater than the distance g2 between the second thermal equilibrium zone HEA2 and the first heater 121. In such an embodiment, the temperature of the second thermal equilibrium zone HEA2 may be lower than the temperature of the first thermal equilibrium zone HEA1, and the temperature of the third thermal equilibrium zone HEA3 may be lower than the temperature of the second thermal equilibrium zone HEA2.

Although the first to third thermal equilibrium zones HEA1, HEA2, and HEA3 are shown together in FIG. 4 for convenience of illustration, the first to third thermal equilibrium zones HEA1, HEA2, and HEA3 may each be formed according to the temperature of the first heater 121 and/or the temperature of the second heater 122. That is, the locations of the first to third thermal equilibrium zones HEA1, HEA2, and HEA3 may be adjusted by adjusting the temperature of the first heater 121 and/or the temperature of the second heater 122. However, the disclosure is not limited thereto, and the plurality of thermal equilibrium zones HEA1, HEA2, and HEA3 may be formed even though the temperatures of the first and second heaters 121 and 122 are uniformly maintained. Although three thermal equilibrium zones HEA1, HEA2, and HEA3 are shown in the drawing, the number of the thermal equilibrium zones HEA1, HEA2, and HEA3 is not limited thereto.

As the thermal equilibrium zone HEA1, HEA2, HEA3 becomes closer to the first heater 121, the temperature increase rate of the target substrate S arranged in each thermal equilibrium zone HEA1, HEA2, HEA3 may vary.

Referring further to FIG. 5, lines on the graph of FIG. 5 represent temperatures of the target substrate S that vary over time. Line (a) of the graph shows the case where the target substrate S is arranged in the first thermal equilibrium zone HEA1 of FIG. 4, line (b) of the graph shows the case where the target substrate S is arranged in the second thermal equilibrium zone HEA2 of FIG. 4, and line (c) of the graph shows the case where the target substrate S is arranged in the third thermal equilibrium zone HEA3 of FIG. 4.

As the thermal equilibrium zone HEA1, HEA2, HEA3 is closer to the first heater 121, the temperature increase rate of the target substrate S arranged in the thermal equilibrium zone HEA1, HEA2, HEA3 may increase. That is, as the thermal equilibrium zone HEA1, HEA2, HEA3 is closer to the first heater 121, the time taken for the target substrate S arranged in each thermal equilibrium zone HEA1, HEA2, HEA3 to reach a threshold temperature (temperature for the bake process) may decrease.

In an embodiment, although not shown in the drawing, the cooling rate of the target substrate S arranged in the thermal equilibrium zone HEA1, HEA2, HEA3 may have a reverse relationship with the temperature increase rate in respect to the distance between the thermal equilibrium zone HEA1, HEA2, HEA3 and the first heater 121. That is, the cooling rate of the target substrate S may increase as the distance between the thermal equilibrium zone HEA1, HEA2, HEA3 in which the target substrate S is arranged and the first heater 121 increases.

In an embodiment, the locations of the thermal equilibrium zones HEA1, HEA2, and HEA3 may be adjusted by adjusting the temperature of the first heater 121 and/or the temperature of the second heater 122, and the temperature increase rate of the target substrate S may be adjusted by arranging the target substrate S in any of the thermal equilibrium zones HEA1, HEA2, and HEA3.

Even when the target substrate S includes a same material, the characteristic of the target substrate S may vary with a change in the temperature increase rate of the target substrate S in the bake process. Such features will hereinafter be described in detail with reference to FIG. 6.

Figure 6:
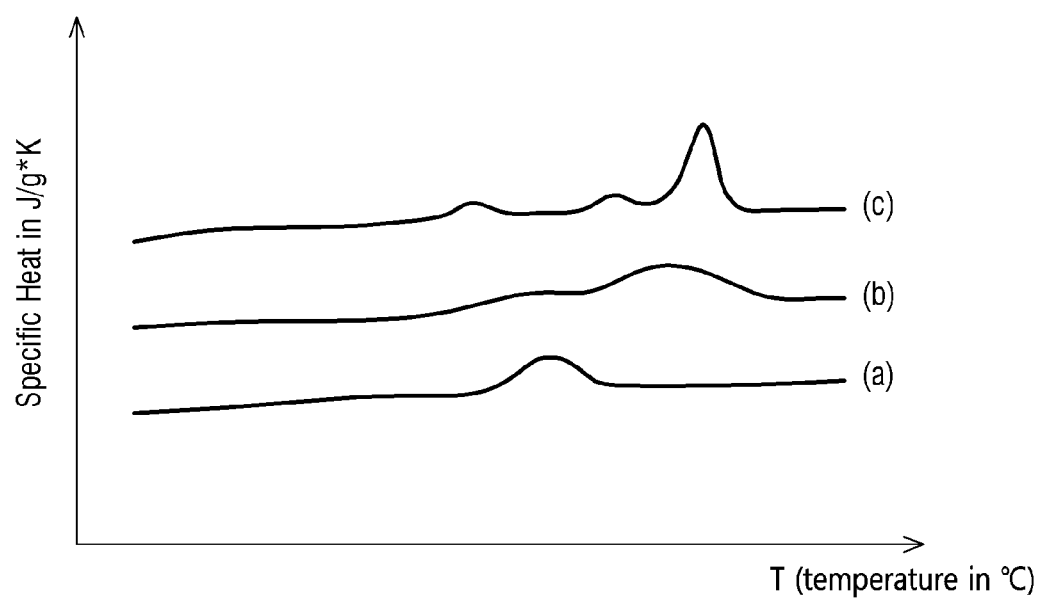
FIG. 6 is a graph of specific heat capacities of a target substrate crystallized in accordance with a temperature increase rate.

FIG. 6 is a graph of specific heat capacities of a target substrate crystallized in accordance with a temperature increase rate.

Referring further to FIG. 6, curves (a), (b), and (c) on the graph of FIG. 6 represent specific heat capacities of the target substrate crystallized in accordance with the temperature increase rate. Curve (a) of the graph shows a case where the target substrate S is arranged in the first thermal equilibrium zone HEA1 of FIG. 4, curve (b) of the graph shows a case where the target substrate S is arranged in the second thermal equilibrium zone HEA2 of FIG. 4, and curve (c) of the graph shows a case where the target substrate S is arranged in the third thermal equilibrium zone HEA3 of FIG. 4.

As the temperature increase rate of the target substrate S is higher, the specific heat capacity of the target substrate S may be smaller after the crystallization of the target substrate S. That is, as the thermal equilibrium zone HEA1, HEA2, HEA3 is closer to the first heater 121, the specific capacity may be smaller when the target substrate S arranged in the thermal equilibrium zone HEA1, HEA2, HEA3 is crystallized by the bake process. In addition, as the temperature increase rate of the target substrate S is higher, the more uniform specific heat capacity may be obtained in accordance with the time of exposure to the thermal atmosphere.

The graph of the specific heat capacities that are shown in FIG. 6 shows an example of change of the characteristic of the target substrate S after the bake process in accordance with the temperature increase rate of the target substrate S. However, the disclosure is not limited thereto and, although will be described later, in the case where the target substrate S includes individual components of the display device, the electrical characteristics of the individual components may vary according to the temperature increase rate of the target substrate S.

The manufacturing apparatus 10 described above may be used for manufacturing a display device. Hereinafter, a display device manufactured using the manufacturing apparatus 10 according to an embodiment will be described with reference to FIGS. 7 and 8.

Figure 7:
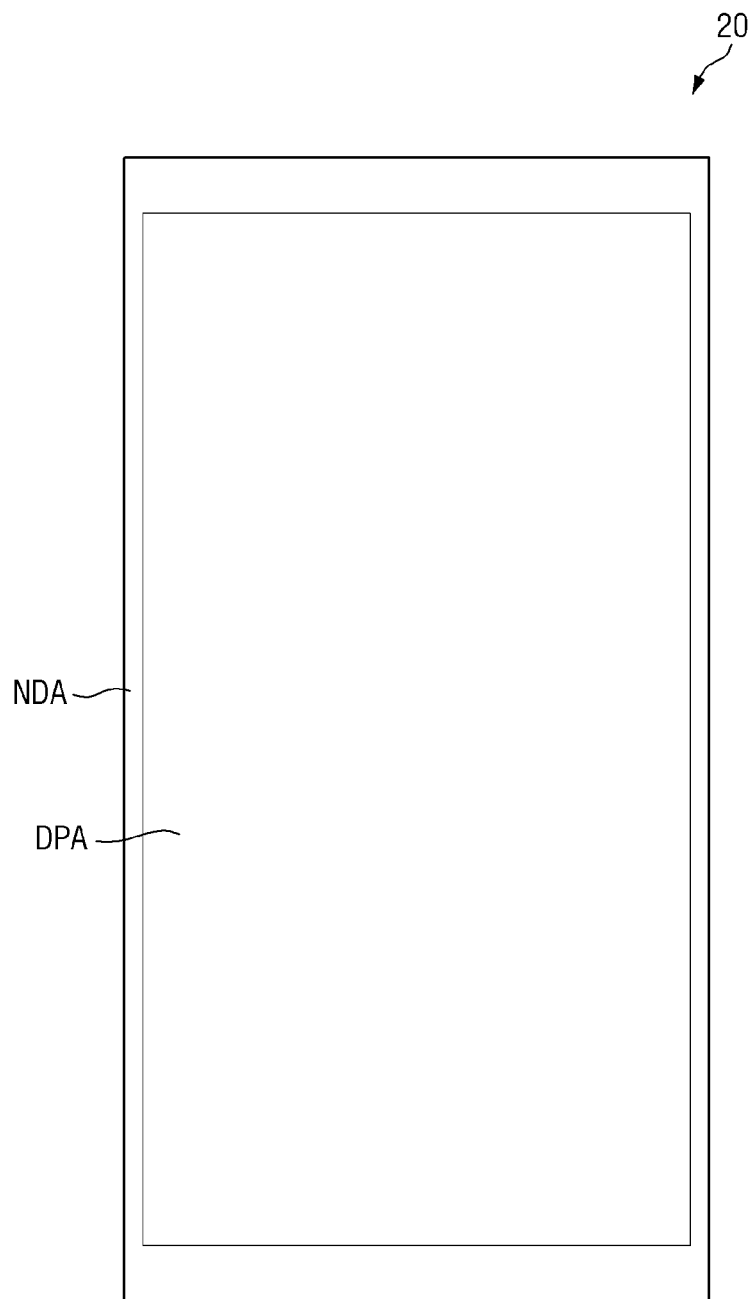
FIG. 7 is a plan view of a display device manufactured by a display device manufacturing apparatus according to an embodiment.
Figure 8:
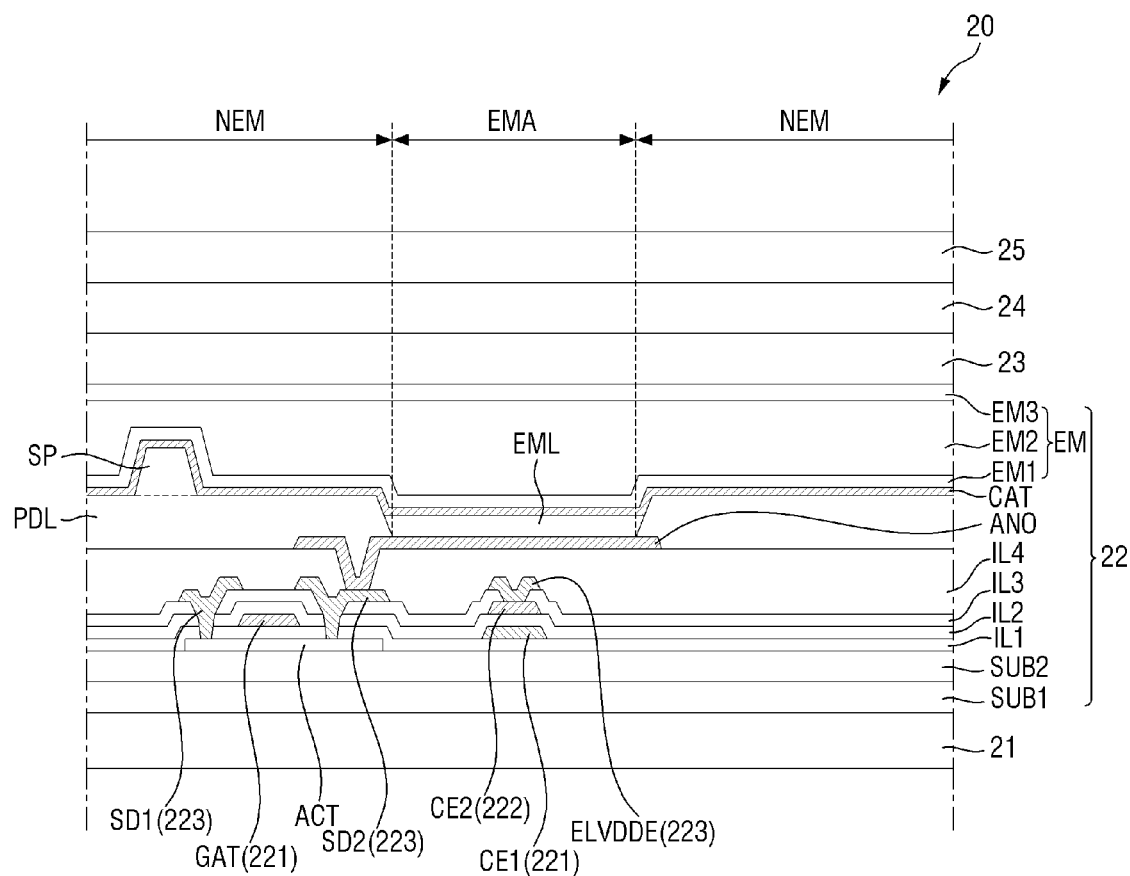
FIG. 8 is a partial cross-sectional view of the display device of FIG. 7.

FIG. 7 is a plan view of a display device manufactured by a display device manufacturing apparatus according to an embodiment. FIG. 8 is a partial cross-sectional view of the display device of FIG. 7.

Referring to FIGS. 7 and 8, a display device 20 may be formed in a substantially rectangular shape in a plan view. The display device 20 may have a rectangular shape with right-angled corners in a plan view. However, the disclosure is not limited thereto, and alternatively, the display device 20 may have a rectangular shape with rounded corners in a plan view.

The display device 20 displays a screen or an image through a display area DPA, and various devices including the display area DPA may be included therein. Examples of the display device 20 may include, but not limited to, a smartphone, a mobile phone, a tablet PC, a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including the display area DPA, an Internet-of-Things device, and the like.

The display device 20 includes the display area DPA and a non-display area NDA. The display area DPA is an area where a screen is defined or an image is displayed, and the non-display area NDA is an area where an image is not displayed.

A plurality of pixels may be disposed in the display area DPA. The pixel is a basic unit for displaying an image. The pixels may include, but not limited to, a red pixel, a green pixel, and a blue pixel. The plurality of pixels may be alternately arranged in a plan view. In one embodiment, for example, the pixels may be arranged in a matrix form, but the disclosure is not limited thereto.

The non-display area NDA may be disposed around the display area DPA. The non-display area NDA may be disposed around the display area DPA and may surround the display area DPA. In one embodiment, for example, the display area DPA may be formed in a rectangular shape, and the non-display area NDA may be disposed around four sides of the display area DPA, but the disclosure is not limited thereto.

Hereinafter, a stacked structure of the display device 20 will be described in detail.

In an embodiment, as shown in FIG. 8, the display device 20 may include a lower member 21, a display panel 22, a touch member 23, an anti-reflection member 24 and a cover window 25. The lower member 21, the display panel 22, the touch member 23, the anti-reflection member 24 and the cover window 25 may be sequentially stacked. At least one bonding member such as an adhesive layer or a tackifier layer may be disposed between the stacked members to bond the adjacent stacked members. However, the disclosure is not limited thereto, and another layer may be further disposed between the respective layers, and some of the stacked members may be omitted.

The display panel 22 is a panel for displaying an image. In an embodiment, the display panel 22 may include not only a self-luminous display panel such as an organic light emitting display ("OLED") panel, an inorganic electroluminescence ("EL") display panel, a quantum dot ("QED") display panel, a micro-light emitting diode ("LED") display panel, a nano-LED display panel, a plasma display panel ("PDP"), a field emission display ("FED") panel and a cathode ray tube ("CRT") display panel, but also a light receiving display panel such as a liquid crystal display ("LCD") panel and an electrophoretic display ("EPD") panel. Hereinafter, for convenience of description, embodiments where the display panel 22 is the organic light emitting display panel will be described in detail. However, the embodiment is not limited to the organic light emitting display panel, and other types of display panel mentioned above or known in the art may be applied within the teaching herein.

The display panel 22 may include a base substrate SUB1, a buffer layer SUB2, a semiconductor layer ACT, a first insulating layer IL1, a first gate conductive layer 221, a second insulating layer IL2, a second gate conductive layer 222, a third insulating layer IL3, a data conductive layer 223, a fourth insulating layer IL4, an anode electrode ANO, a pixel defining layer PDL including an opening exposing the anode electrode ANO, a light emitting layer EML disposed in the opening of the pixel defining layer PDL, a cathode electrode CAT disposed on the light emitting layer EML and the pixel defining layer PDL, and a thin film encapsulation layer EM disposed on the cathode electrode CAT. Each of the layers described above may have a single layer structure, or a multilayer structure with a stack of multiple layers. Other layers may be further disposed between the layers.

The base substrate SUB1 may support respective layers disposed thereon. The base substrate SUB1 may include or be made of an insulating material such as a polymer resin or an inorganic material such as glass or quartz.

The buffer layer SUB2 is disposed on the base substrate SUB1. The buffer layer SUB2 may include silicon nitride, silicon oxide, silicon oxynitride, or the like.

The semiconductor layer ACT is disposed on the buffer layer SUB2. The semiconductor layer ACT forms a channel of a thin film transistor of a pixel. The semiconductor layer ACT may include or be made of polycrystalline silicon, monocrystalline silicon, amorphous silicon, or the like, or may include an oxide semiconductor. The polycrystalline silicon may be formed by crystallizing amorphous silicon, but the disclosure is not limited thereto. The oxide semiconductor may include indium gallium zinc oxide ("IGZO") or the like.

The first insulating layer IL1 is disposed on the semiconductor layer ACT. The first insulating layer IL1 may be a gate insulating layer having a gate insulating function.

The first gate conductive layer 221 is disposed on the first insulating layer ILL The first gate conductive layer 221 may include a gate electrode GAT of a thin transistor of a pixel, a scan line connected thereto and a first electrode CE1 of a storage capacitor.

The second insulating layer IL2 may be disposed on the first gate conductive layer 221. The second insulating layer IL2 may be an interlayer insulating layer or a second gate insulating layer.

The second gate conductive layer 222 is disposed on the second insulating layer IL2. The second gate conductive layer 222 may include a second electrode CE2 of the storage capacitor.

The third insulating layer IL3 is disposed on the second gate conductive layer 222. The third insulating layer IL3 may be an interlayer insulating layer.

The data conductive layer 223 is disposed on the third insulating layer IL3. The data conductive layer 223 may include a first electrode SD1, a second electrode SD2 of the thin film transistor of the pixel and a first power line ELVDDE. The first electrode SD1 and the second electrode SD2 of the thin film transistor may be electrically connected to a source region and a drain region of the semiconductor layer ACT via contact holes defined through the third insulating layer IL3, the second insulating layer IL2 and the first insulating layer ILL The fourth insulating layer IL4 is disposed on the data conductive layer 223. The fourth insulating layer IL4 covers the data conductive layer 223. The fourth insulating layer IL4 may be a via layer or a planarization layer.

The anode electrode ANO is disposed on the fourth insulating layer IL4. The anode electrode ANO may be a pixel electrode provided for each pixel. The anode electrode ANO may be connected to the second electrode SD2 of the thin film transistor via a contact hole defined through the fourth insulating layer IL4.

The anode electrode ANO may have a stacked structure formed by stacking a material layer having a high work function, such as indium tin oxide ("ITO"), indium zinc oxide ("IZO"), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to the light emitting layer EML. The anode electrode ANO may have a multilayer structure such as ITO/Mg, ITO/MgF, ITO/Ag and ITO/Ag/ITO, but is not limited thereto.

The pixel defining layer PDL may be disposed on the anode electrode ANO. The pixel defining layer PDL is disposed on the anode electrode ANO, and an opening is defined through the pixel defining layer PDL to expose the anode electrode ANO. Emission areas EMA and non-emission areas NEM may be distinguished or defined by the pixel defining layer PDL and the openings of the pixel defining layer PDL, respectively.

A spacer SP may be disposed on the pixel defining layer PDL. The spacer SP may serve to maintain a gap with a structure disposed thereabove.

The light emitting layer EML is disposed on the anode electrode ANO exposed by the pixel defining layer PDL. The light emitting layer EML may include an organic material layer. The organic material layer of the light emitting layer may include an organic light emitting layer, and may further include a hole injecting/transporting layer and/or an electron injecting/transporting layer.

The light emitting layer EML may be formed by the manufacturing apparatus 10 (see FIG. 1) of a display device according to an embodiment. The light emitting layer EML may also be formed through the above-described bake process, and the temperature increase rate may vary in accordance with the location of the target substrate S (see FIG. 1), which leads to variation of the thermal, electrical, and/or optical characteristics of the light emitting layer EML. The organic material layer included in the light emitting layer EML may be deposited through an inkjet printing, but the disclosure is not limited thereto.

In an embodiment, the organic film (organic layer) of the display device 20 as well as the light emitting layer EML may be formed through the bake process in the manufacturing process, and the thermal, electrical, and/or optical characteristics of the organic film (organic layer) may vary according to the location where the target substrate S (see FIG. 1) is arranged in the bake process.

The cathode electrode CAT may be disposed on the light emitting layer EML.

The cathode electrode CAT may be a common electrode extended across all the pixels. The anode electrode ANO, the light emitting layer EML and the cathode electrode CAT may constitute an organic light emitting diode.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode CAT may further include a transparent metal oxide layer disposed on the material layer having a low work function.

The thin film encapsulation layer EM including a first inorganic film EM1, a first organic film EM2 and a second inorganic film EM3 is disposed on the cathode electrode CAT. The first inorganic film EM1 and the second inorganic film EM3 may be in contact with each other at an end portion of the thin film encapsulation layer EM. The first organic film EM2 may be sealed by the first inorganic film EM1 and the second inorganic film EM3.

Each of the first inorganic film EM1 and the second inorganic film EM3 may include silicon nitride, silicon oxide, silicon oxynitride, or the like. The first organic film EM2 may include an organic insulating material.

The touch member 23 may be disposed on the display panel 22. The touch member 23 may sense a touch input. In an embodiment, the touch member 23 may be provided as a panel or a film separate from the display panel 22 as illustrated, and may be attached onto the display panel 22. Alternatively, the touch member 23 may be provided in the form of a touch layer inside the display panel 22.

The anti-reflection member 24 may be disposed on the touch member 23. The anti-reflection member 24 may polarize light passing therethrough or selectively transmit light having a specific wavelength. The anti-reflection member 24 may serve to reduce the reflection of external light.

The cover window 25 may be disposed on the touch member 23. The cover window 25 serves to cover and protect the display panel 22. The cover window 25 may include or be made of a transparent material. The cover window 25 may include, for example, a glass or a plastic.

The lower member 21 may be disposed below the display panel 22. The lower member 21 may perform a light blocking function. That is, the lower member 21 may block light from entering the display panel 22 from the outside. Further, the lower member 21 may perform an impact absorbing function other than the light blocking function.

Hereinafter, alternative embodiments will be described with reference to FIGS. 9 to 13. The same or like elements shown in FIGS. 9 to 13 have been labeled with the same reference characters as used above to describe the embodiments shown in FIGS. 1 to 8, and any repetitive detailed description thereof will hereinafter be omitted or simplified.

Figure 9:
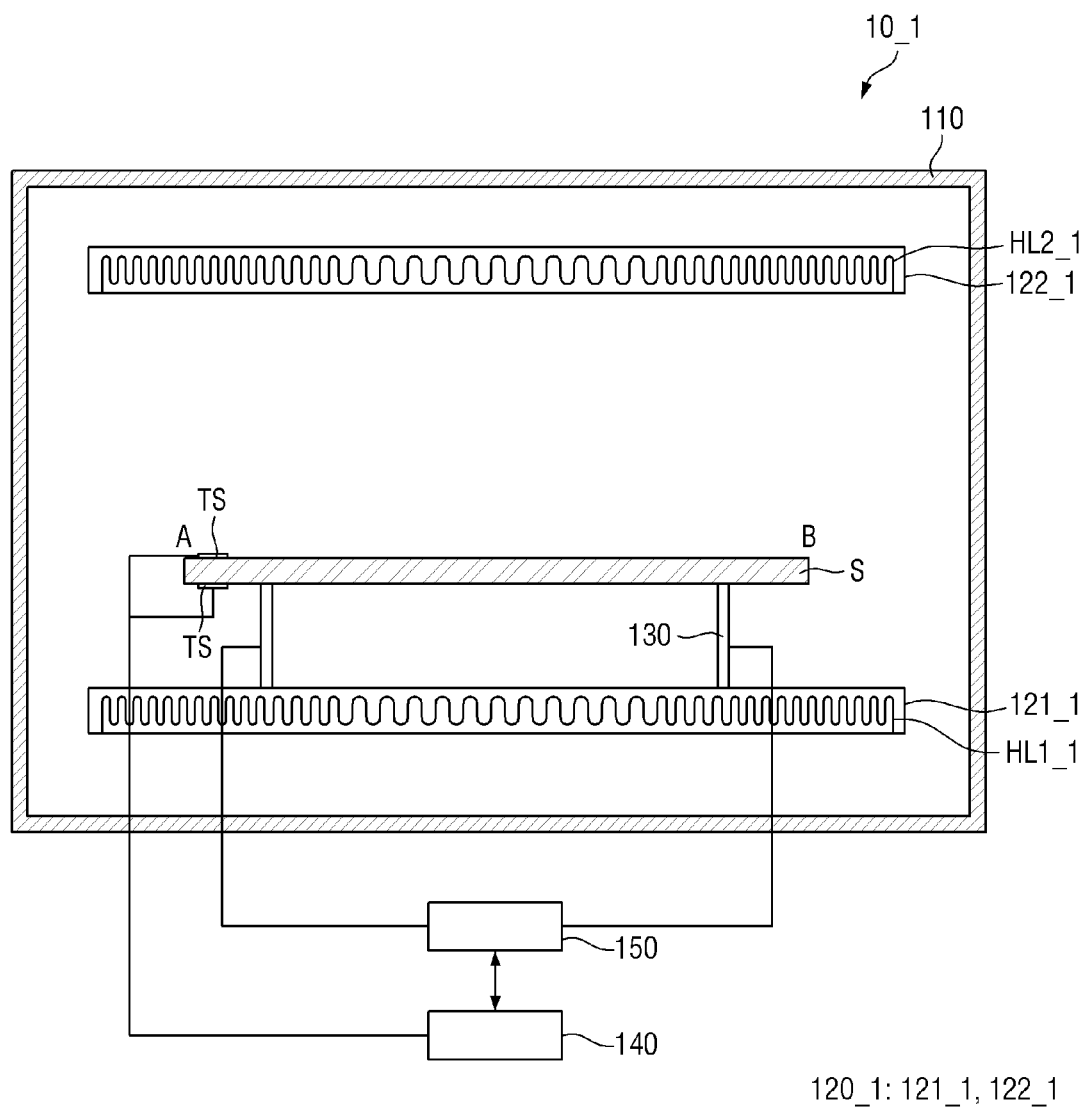
FIG. 9 is a view schematically illustrating a manufacturing apparatus according to an alternative embodiment.
Figure 10:
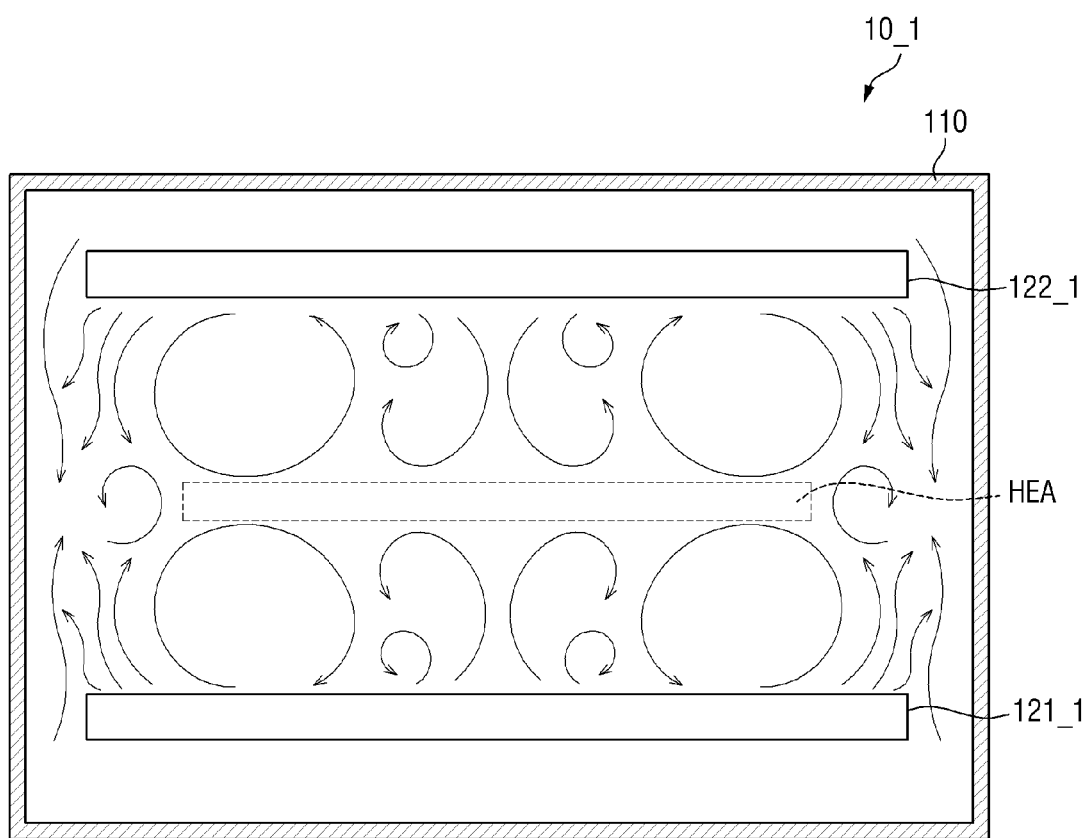
FIG. 10 is a view schematically illustrating heat flows inside a manufacturing apparatus according to the embodiment of FIG. 9.
Figure 11:
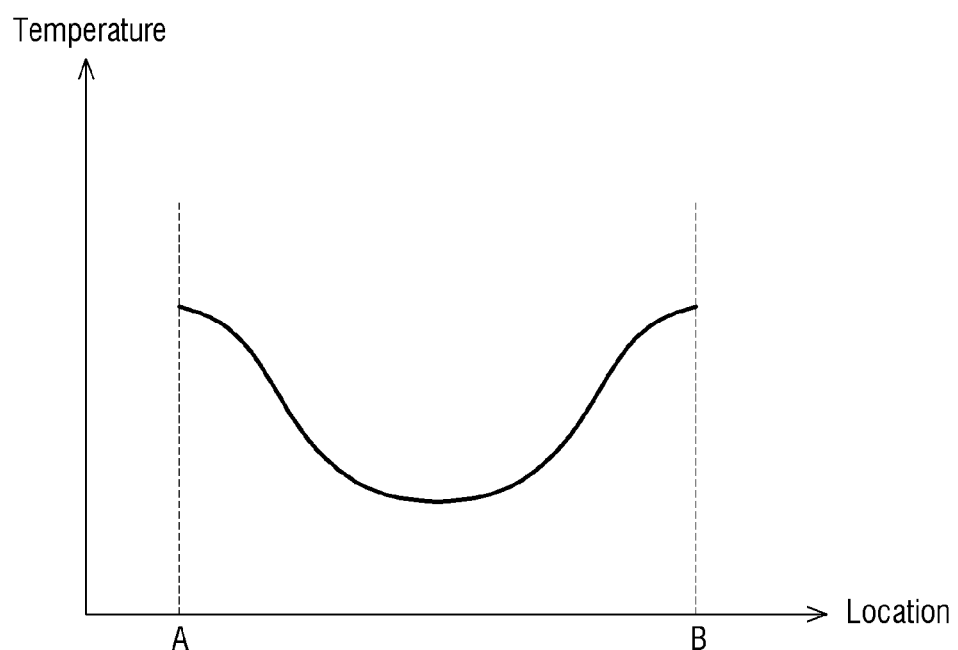
FIG. 11 is a graph of a temperature varying in accordance with a location between point A and point B of a first heater.

FIG. 9 is a view schematically illustrating a manufacturing apparatus according to an alternative embodiment. FIG. 10 is a view schematically illustrating heat flows inside a manufacturing apparatus according to the embodiment of FIG. 9. FIG. 11 is a graph of a temperature varying in accordance with a location between point A and point B of a first heater.

The embodiment of a manufacturing apparatus 10_1 shown in FIGS. 9 to 11 is substantially the same as the embodiment of FIG. 1 except that the density of heating wires HL1_1 and HL2_1 of first and second heaters 121_1 and 122_1 is not uniform.

In such an embodiment, the manufacturing apparatus 10_1 may include a heating member 120_1 including a first heater 121_1 and a second heater 122_2. In such an embodiment, the first heater 121_1 includes the first heating wire HL1_1, and the second heater 122_2 includes the second heating wire HL2_1.

The density of the first heating wire HL1_1 inside the first heater 121_1 may not be uniform. The density of the first heating wire HL1_1 may increase in the direction toward the edges of the first heater 121_1 and decrease in the direction toward the center of the first heater 121_1. That is, the distance between adjacent bars of the zigzag of the first heating wire HL1_1 around the edge of the first heater 121_1 may be smaller than the distance between adjacent bars of the zigzag of the first heating wire HL_1 around the center of the first heater 121_1.

Accordingly, the temperature of the first heater 121_1 may differ with position. That is, the temperature around the edge of the first heater 121_1 in which the density of the first heating wire HL1_1 is relatively high may be higher than the temperature around the center of the first heater 121_1 in which the density of the first heating wire HL1_1 is relatively low, but the disclosure is not limited thereto. In such an embodiment, the characteristics of the second heating wires HL2_1 in the second heater 122_1 is substantially the same as those of the first heating wire HL1_1 in the first heater 121_1, and any repetitive detailed description thereof will be omitted.

In such an embodiment, the temperature of the first heater 121_1 may gradually decrease and then increase again from point A close to one side surface of the first heater 121_1 to point B close to the other side surface of the first heater 121_1 that is opposite to the one side surface. The temperature of the first theater 121_1 is the highest at points A and B, and the temperature at the area between points A and B may be lower than the temperature at points A and B. The temperature of the first heater 121_1 may decrease as going from points A and B to the center between points A and B.

In such an embodiment, the temperature at the edges of the first and second heaters 121_1 and 122_1 is relatively higher than the temperature at the centers of the first and second heaters 121_1 and 122_1, such that the first and second heaters 121_1 and 122_1 may emit a relatively large amount of heat around the edges thereof. Accordingly, even though heat exchange occurs through convection and/or radiation between the inside and the outside around the edges of the first and second heaters 121_1 and 122_1, a more uniform thermal atmosphere may be formed in the inside between the first and second heaters 121_1 and 122_1. Accordingly, in such an embodiment, heat uniformity and heat stability of the thermal equilibrium zone HEA may be improved.

In such an embodiment, even when the size of the first heater 121_1 increases in line with the increase of the size of the target substrate S, the bake process may be performed with a uniform thermal atmosphere over the whole area of the target substrate S, and the temperature increase rate of the target substrate S may be adjusted by adjusting the location of the thermal equilibrium zone HEA.

Figure 12:
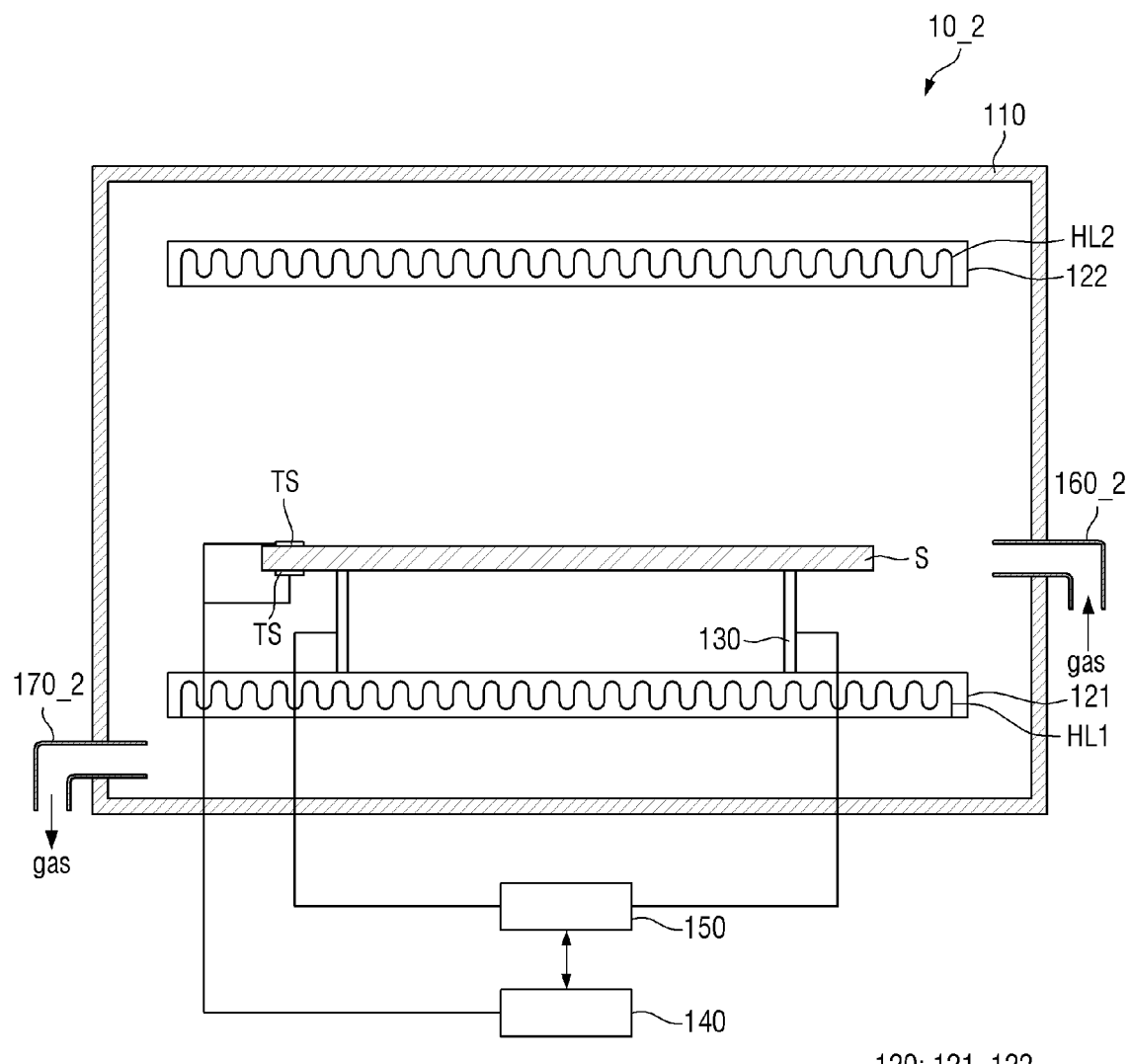
FIG. 12 is a view schematically illustrating a manufacturing apparatus according to another alternative embodiment.

FIG. 12 is a view schematically illustrating a manufacturing apparatus according to another alternative embodiment.

The embodiment of a manufacturing apparatus 102 of a display device shown in FIG. 12 is substantially the same as the embodiment of FIG. 1 except that the manufacturing apparatus 10_2 further includes a gas supply unit 160_2 for supplying gas into the chamber 110 and a gas exhaust unit 170_2 for discharging the gas.

In such an embodiment, the manufacturing apparatus 10_2 of a display device may further include the gas supply unit 160_2 and the gas exhaust unit 170_2 connected to the chamber 110. The gas supply unit 160_2 may be connected to one surface of the chamber 110, and the gas exhaust unit 170_2 may be connected to the other surface opposite to the one surface, but the disclosure is not limited thereto.

The gas supply unit 160_2 may supply the gas to the inside of the chamber 110. The gas may include, but not limited to, nitrogen ($N_2$) or argon (Ar). The gas exhaust unit 170_2 may discharge the gas, which the gas supply unit 160_2 has supplied to the inside of the chamber 110, to the outside of the chamber 110.

The gas may be provided in the process of cooling the target substrate S to accelerate the cooling rate of the target substrate S. The temperature of the gas may be, for example, equal to or less than 0° C. or equal to or less than −30° C., without being limited thereto. The gas may also be provided while the target substrate S moves from the first heater 121 to the second heater 122. That is, the gas may be provided while the target substrate S and the first heater 121 are separated away from each other and/or while the separation distance between the target substrate S and the first heater 121 increases, but the disclosure is not limited thereto.

In such an embodiment, even when the size of the first heater 121 increases in line with the increase of the size of the target substrate S, the bake process may be performed with a uniform thermal atmosphere over the whole area of the target substrate S, and the temperature increase rate of the target substrate S may be adjusted by adjusting the location of the thermal equilibrium zone HEA.

Figure 13:
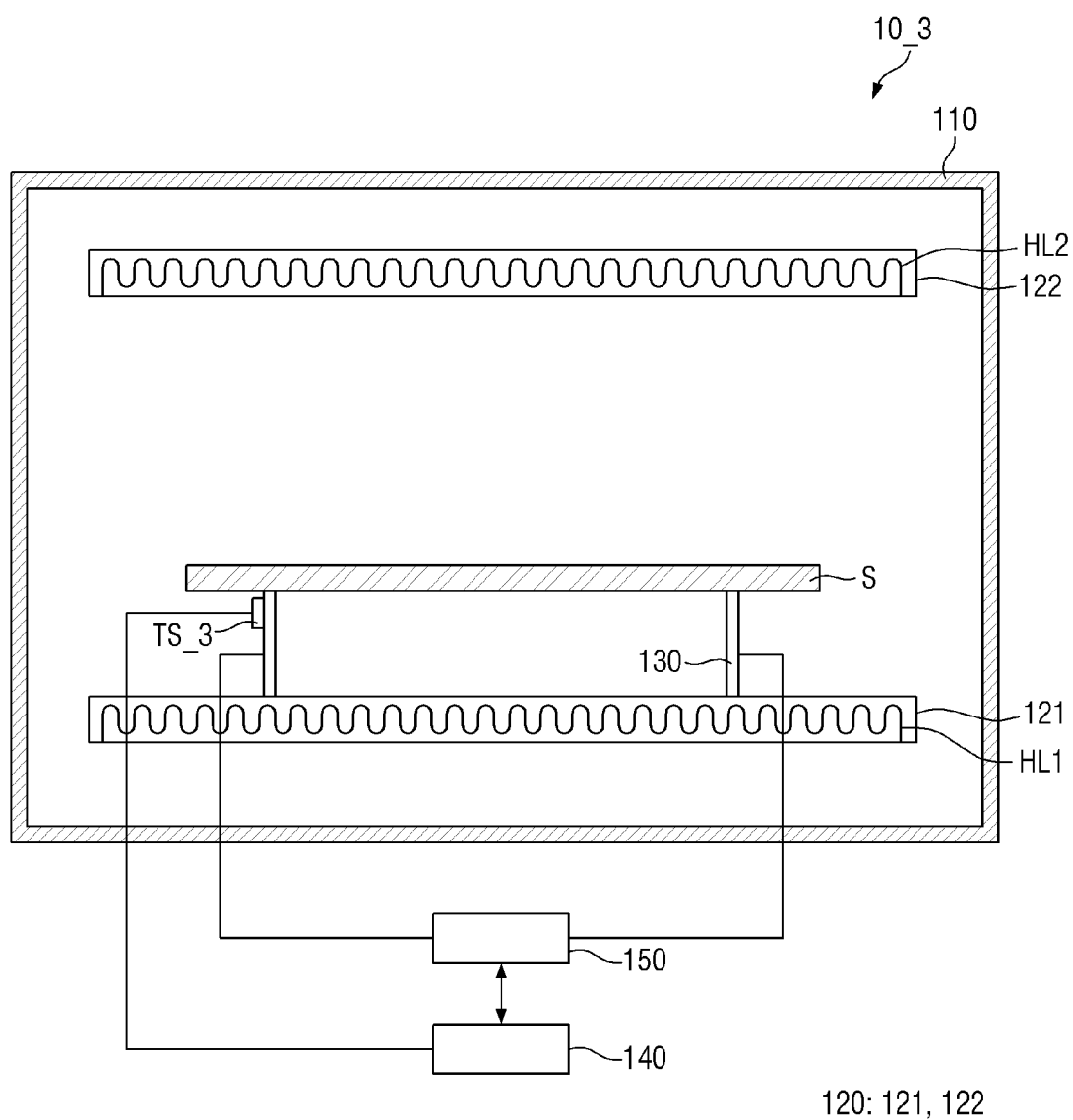
FIG. 13 is a view schematically illustrating a manufacturing apparatus according to still another alternative embodiment.

FIG. 13 is a view schematically illustrating a manufacturing apparatus according to still another alternative embodiment.

The embodiment of the manufacturing apparatus 10_3 of a display device shown in FIG. 13 is substantially the same as the embodiment of FIG. 1 except that of the manufacturing apparatus 10_3 includes a location measurement unit TS_3 arranged on the height adjustment member 130.

In such an embodiment, the location management unit TS_3 may be arranged on the height adjustment member 130 inside the chamber 110. The location measurement unit TS_3 may be arranged on the height adjustment member 130 and vary in height as the height adjustment member 130 moves up and down. In such an embodiment, the location measurement unit TS_3 may include a temperature sensor to measure the temperature inside the chamber 110 even in the case where no target substrate S is arranged on the height adjustment member 130.

In such an embodiment, even when the size of the first heater 121 increases in line with the increase of the size of the target substrate S, the bake process may be performed with a uniform thermal atmosphere over the whole area of the target substrate S, and the temperature increase rate of the target substrate S may be adjusted by adjusting the location of the thermal equilibrium zone HEA. By using the location measurement unit TS_3 arranged on the height adjustment member 130, the location of the thermal equilibrium zone HEA (see FIG. 3) may be effectively measured in accordance with the temperatures of the first and second heaters 121 and 122.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An apparatus for manufacturing a display device, the apparatus comprising:
a chamber in which an inner space is defined;
a heating member disposed in the inner space of the chamber to provide a thermal atmosphere inside the chamber, wherein the heating member includes a first heater and a second heater facing each other;
a height adjustment member including an end disposed between the first heater and the second heater; and
a driving unit which drives the end of the height adjustment member to move up or down such that the end of the height adjustment member is located at one of a first height and a second height which are different heights between the first heater and the second heater,
wherein the first heater is disposed at a lower part of the inner space of the chamber, the second heater is disposed at an upper part of the inner space of the chamber, and the end of the height adjustment member is disposes at a middle part of the inner space of the chamber, and
wherein each of the first height and the second height is different from a height of a top surface of the first heater, and different from a height of a bottom surface of the second heater facing the top surface of the first heater.

2. The apparatus of claim 1, wherein
a target substrate is disposed on the end of the height adjustment member,
the target substrate is spaced apart from the first heater and the second heater, and
a temperature of the target substrate is different from a temperature of the first heater and a temperature of the second heater.

3. The apparatus of claim 2, wherein as a height difference between the end of the height adjustment member and the top surface of the first heater decreases, a temperature increase rate of the target substrate increases, and a cooling rate of the target substrate decreases.

4. The apparatus of claim 2, wherein
the first heater and the second heater are parallel to each other, and
the height adjustment member supports the target substrate in parallel with the first heater and the second heater.

5. The apparatus of claim 1, wherein
a thermal equilibrium zone which is thermally uniform is located between the first heater and the second heater, and
the end of the height adjustment member located at the one of the first height and the second height is located within the thermal equilibrium zone.

6. The apparatus of claim 5, further comprising:
a comparison operation unit which compares a height of the end of the height adjustment member with a height of the thermal equilibrium zone,
wherein the driving unit adjusts a height of the end of the height adjustment member based on a comparison result of the comparison operation unit.

7. The apparatus of claim 6, further comprising:
a location measurement unit which measures a location of the thermal equilibrium zone between the first heater and the second heater.

8. The apparatus of claim 2, wherein each of a width of the first heater and a width of the second heater is greater than a width of the target substrate.

9. The apparatus of claim 8, wherein each of a side surface of the first heater and a side surface of the second heater protrudes further outward than a side surface of the target substrate.

10. The apparatus of claim 9, wherein each of an area of the first heater and an area of the second heater is larger than an area of the target substrate.

11. The apparatus of claim 1, wherein
a width of the first heater is equal to a width of the second heater, and
a side surface of the first heater and a side surface of the second heater are aligned with each other.

12. The apparatus of claim 1, wherein
a temperature of the first heater increases from a center toward an edge of the first heater, and
a temperature of the second heater increases from a center toward an edge of the second heater.

13. The apparatus of claim 12, wherein
the first heater includes a first heating wire, and the second heater includes a second heating wire,
a density of the first heating wire increases from the center toward the edge of the first heater, and
a density of the second heating wire increases from the center toward the edge of the second heater.

14. The apparatus of claim 1, further comprising:
a gas supply unit connected to the chamber to supply gas into the chamber; and
a gas exhaust unit connected to the chamber to discharge the gas,
wherein the gas supplied from the gas supply unit includes at least one selected from nitrogen ($N_2$) and argon (Ar).

15. An apparatus for manufacturing a display device, the apparatus comprising:
a chamber in which an inner space is defined;
a heating member including a first heater disposed at a lower part of the inner apace of the chamber and a second heater disposed at an upper part of the inner space of the chamber;
a height adjustment member which supports a target substrate, wherein at least a portion of the height adjustment member is disposed at a middle part of the inner space of chamber between the first heater and the second heater; and
a driving unit which adjusts a height of the target substrate by raising or lowering the height adjustment member to a predetermined height, wherein
each of a width of the first heater and a width of the second heater is greater than a width of the target substrate, and
each of a side surface of the first heater and a side surface of the second heater protrudes further outward than a side surface of the target substrate.

16. The apparatus of claim 15, wherein
a thermal equilibrium zone, which is thermally uniform, is located between the first heater and the second heater, and
the target substrate is disposed in the thermal equilibrium zone.

17. The apparatus of claim 16, further comprising:
a comparison operation unit which compares a location of the target substrate with a location of the thermal equilibrium zone,
wherein the driving unit adjusts a height of the height adjustment member based on a comparison result of the comparison operation unit to locate the target substrate in the thermal equilibrium zone.

18. The apparatus of claim 15, wherein
a temperature of the first heater increases from a center toward an edge of the first heater, and
a temperature of the second heater increases from a center toward an edge of the second heater.

19. The apparatus of claim 18, wherein
the first heater includes a first heating wire, and the second heater includes a second heating wire,
a density of the first heating wire increases from the center toward the edge of the first heater, and
a density of the second heating wire increases from the center toward the edge of the second heater.

20. The apparatus of claim 15, wherein each of an area of the first heater and an area of the second heater is larger than an area of the target substrate.

* * * * *